US012604685B2

(12) United States Patent
Huli et al.

(10) Patent No.: US 12,604,685 B2
(45) Date of Patent: Apr. 14, 2026

(54) METHODS FOR CONTROLLING SPIN-ON SELF-ASSEMBLED MONOLAYER (SAM) SELECTIVITY

(71) Applicant: Tokyo Electron Limited, Tokyo (JP)

(72) Inventors: Lior Huli, Albany, NY (US); Nathan Antonovich, Albany, NY (US); Dina Triyoso, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 370 days.

(21) Appl. No.: 18/223,881

(22) Filed: Jul. 19, 2023

(65) Prior Publication Data

US 2025/0029833 A1      Jan. 23, 2025

(51) Int. Cl.
*H10P 14/60*          (2026.01)
*C23C 16/04*          (2006.01)
(Continued)

(52) U.S. Cl.
CPC ........ *H10P 14/6506* (2026.01); *C23C 16/042* (2013.01); *C23C 16/403* (2013.01); *C23C 16/45525* (2013.01); *H10P 14/6334* (2026.01)

(58) Field of Classification Search
CPC ............... H01L 21/02; H01L 21/02266; H01L 21/02271; H01L 21/0228; H01L 21/02304;
(Continued)

(56) References Cited

U.S. PATENT DOCUMENTS

| 7,309,658 | B2 | 12/2007 | Lazaovsky et al. |
| 7,902,064 | B1 | 3/2011 | Chiang et al. |

(Continued)

FOREIGN PATENT DOCUMENTS

| JP | 2018137435 | 8/2018 |
| KR | 20190103495 | 9/2019 |

(Continued)

OTHER PUBLICATIONS

International Search Report and The Written Opinion; Application No. PCT/US2024/029373; Sep. 5, 2024, 8 pgs.

*Primary Examiner* — Brook Kebede
(74) *Attorney, Agent, or Firm* — Egan, Enders & Huston LLP.

(57)          ABSTRACT
Various embodiments of methods are provided to control formation of self-assembled monolayers (SAMs) used in an area-selective deposition (ASD) process, and thus, prevent defects in the ASD process. In the disclosed embodiments, a SAM structure is formed via a spin-on process that includes: (a) a spin coating step for coating a surface of a semiconductor substrate with a liquid solution containing SAM-forming molecules, the semiconductor substrate having a target material and a non-target material exposed on the substrate surface, and (b) an anneal step for heat treating the semiconductor substrate to chemically bond the SAM-forming molecules to the non-target material exposed on the substrate surface. By controlling and/or varying process parameter(s) utilized during the anneal step, the embodiments disclosed herein improve the selectivity of the SAM structure to the non-target material and prevent defects from occurring when a film is subsequently deposited onto the target material.

18 Claims, 11 Drawing Sheets

(51) Int. Cl.
   *C23C 16/40*      (2006.01)
   *C23C 16/455*      (2006.01)

(58) Field of Classification Search
   CPC ..... H01L 21/32; H01L 21/321; H01L 21/768;
            H01L 21/76831; H01L 21/76834; H01L
            21/76883; C23C 16/02; C23C 16/04;
            C23C 16/40; C23C 16/403; C23C 16/455;
            C23C 16/45525; C23C 16/042; H10P
            14/60; H10P 14/61; H10P 14/6329; H10P
            14/6334; H10P 14/6339; H10P 14/6506
   See application file for complete search history.

(56)                 References Cited

U.S. PATENT DOCUMENTS

| | | |
|---|---|---|
| 8,986,488 B2 | 3/2015 | Hattori et al. |
| 9,418,834 B2 | 8/2016 | Negreira et al. |
| 10,734,278 B2 | 8/2020 | Aizawa et al. |
| 2004/0163758 A1 | 8/2004 | Kagan et al. |
| 2015/0147879 A1* | 5/2015 | Chatterjee ......... H01L 23/53238 |
| | | 438/653 |
| 2017/0323781 A1 | 11/2017 | Kachian et al. |
| 2021/0098290 A1* | 4/2021 | Hsueh ............... H01L 21/76897 |
| 2021/0175118 A1 | 6/2021 | Negreira et al. |
| 2022/0115267 A1* | 4/2022 | Guan ............... H01L 23/53223 |
| 2023/0009688 A1 | 1/2023 | Triyoso et al. |

FOREIGN PATENT DOCUMENTS

| | | | |
|---|---|---|---|
| WO | 2006112408 | 10/2006 | |
| WO | WO-2021118993 A1 * | 6/2021 | ....... H01L 21/76829 |

\* cited by examiner

300

Pre-Clean — 310

Spin Coat — 320

Anneal — 330

Rinse — 340

Figure 8:
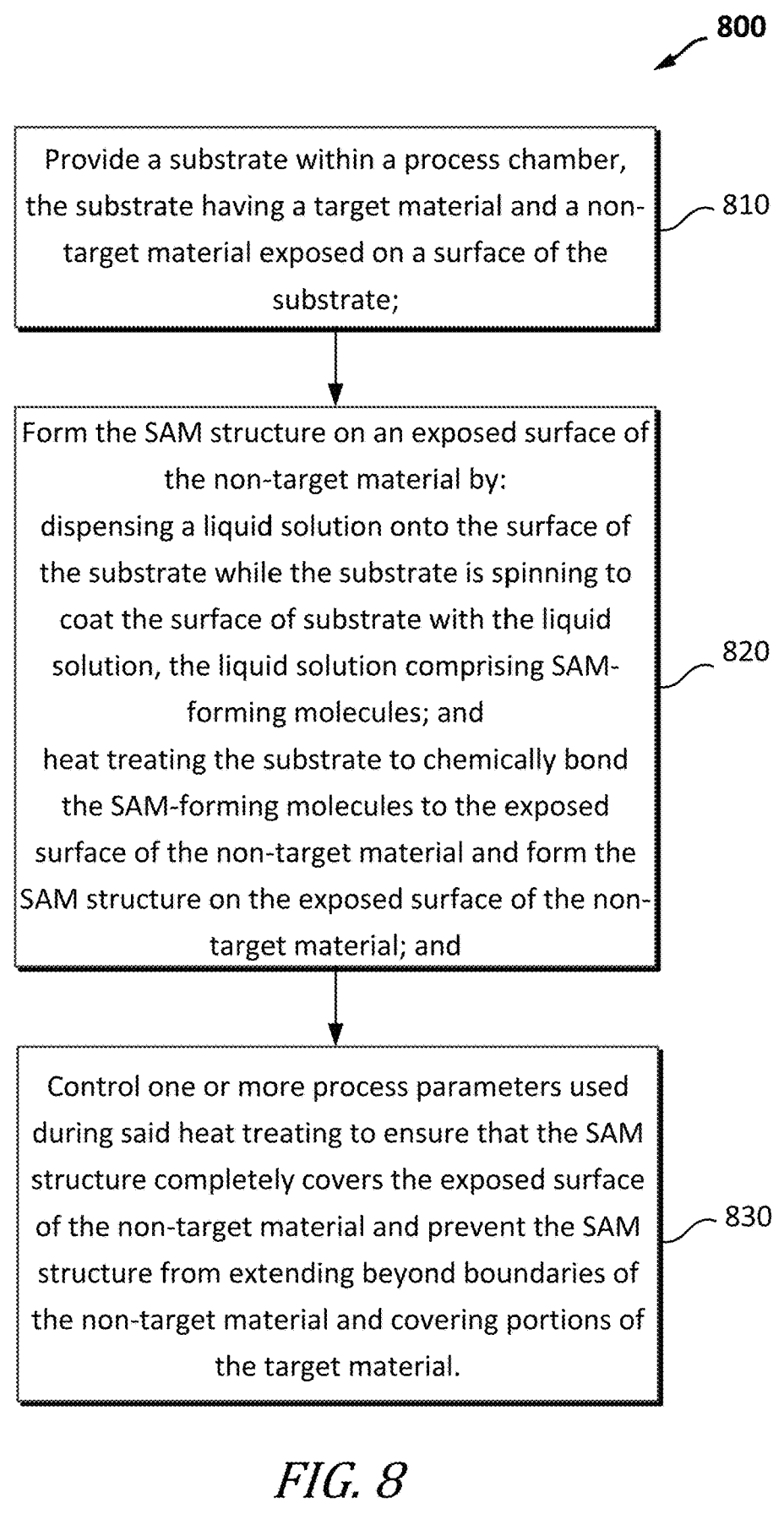

800

Provide a substrate within a process chamber, the substrate having a target material and a non-target material exposed on a surface of the substrate; — 810

Form the SAM structure on an exposed surface of the non-target material by:

dispensing a liquid solution onto the surface of the substrate while the substrate is spinning to coat the surface of substrate with the liquid solution, the liquid solution comprising SAM-forming molecules; and heat treating the substrate to chemically bond the SAM-forming molecules to the exposed surface of the non-target material and form the SAM structure on the exposed surface of the non-target material; and — 820

Control one or more process parameters used during said heat treating to ensure that the SAM structure completely covers the exposed surface of the non-target material and prevent the SAM structure from extending beyond boundaries of the non-target material and covering portions of the target material. — 830

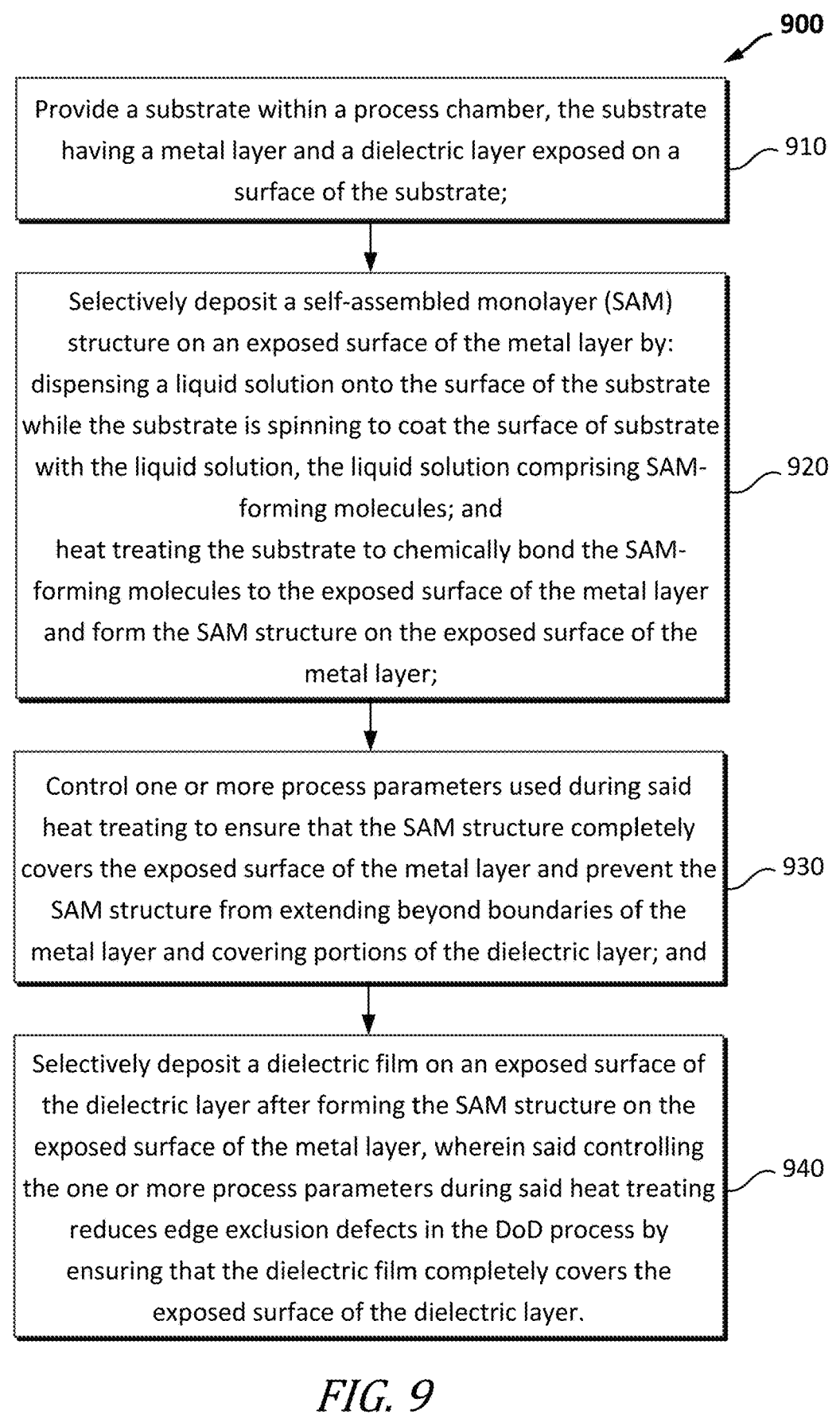

Provide a substrate within a process chamber, the substrate having a metal layer and a dielectric layer exposed on a surface of the substrate;                                          910

Selectively deposit a self-assembled monolayer (SAM) structure on an exposed surface of the metal layer by: dispensing a liquid solution onto the surface of the substrate while the substrate is spinning to coat the surface of substrate with the liquid solution, the liquid solution comprising SAM-forming molecules; and
heat treating the substrate to chemically bond the SAM-forming molecules to the exposed surface of the metal layer and form the SAM structure on the exposed surface of the metal layer;                                          920

Control one or more process parameters used during said heat treating to ensure that the SAM structure completely covers the exposed surface of the metal layer and prevent the SAM structure from extending beyond boundaries of the metal layer and covering portions of the dielectric layer; and                                          930

Selectively deposit a dielectric film on an exposed surface of the dielectric layer after forming the SAM structure on the exposed surface of the metal layer, wherein said controlling the one or more process parameters during said heat treating reduces edge exclusion defects in the DoD process by ensuring that the dielectric film completely covers the exposed surface of the dielectric layer.                                          940

*FIG. 9*

METHODS FOR CONTROLLING SPIN-ON SELF-ASSEMBLED MONOLAYER (SAM) SELECTIVITY

BACKGROUND

The present disclosure relates to the processing of substrates. In particular, it provides improved processes and methods for controlling the selectivity of self-assembled monolayers (SAMs) formed on substrates.

As geometries in substrate processing continue to shrink, the technical challenges to forming structures on substrates increase. Lithography techniques are particularly challenging for shrinking geometries. One traditional substrate lithography method utilizes a photolithography process which includes photoresist coating, exposure, and photoresist develop steps. The materials and processes utilized in these steps may all impact critical dimension targeting, line roughness, and uniformity on a substrate.

With continued shrinkage of integrated circuit (IC) device feature size down to angstrom-level, conventional lithography will hit its resolution limit or will become too costly to use at scale. One strategy is to relax the dependence on lithography using chemically-directed, self-aligned, selective, bottom-up patterning. At the core of this strategy is area-selective processing (ASP), which is centered on the idea of exploiting the surface chemistry of exposed material layers to drive selective processing of such layers. Area-selective processing techniques can be used to selectively deposit and/or remove material from desired areas of a patterned substrate, thereby avoiding the use of photolithography for patterning.

Area selective deposition (ASD) is one example of a bottom-up, area-selective process that provides uniform deposition of material in only desired areas of a patterned substrate. Unlike conventional deposition techniques, which are designed to achieve uniform deposition over large areas, ASD enables materials to be selectively deposited on target areas (or "growth surfaces"), while avoiding deposition on nontarget areas (or "nongrowth surfaces"). ASD can be used to selectively deposit a wide variety of materials on target materials. For example, ASD techniques can be used to selectively deposit dielectric-on-dielectric (DoD), dielectric-on-metal (DOM), metal-on-dielectric (MoD) and metal-on-metal (MoM).

Area selective deposition can be achieved using a wide variety of deposition techniques, such as chemical vapor deposition (CVD), atomic layer deposition (ALD) and molecular layer deposition (MLD), which often utilize surface modifications and vapor phase deposition to deposit material on a target area. Surface modifications are typically aimed at promoting the adsorption of precursor molecules on growth surfaces and/or suppressing the adsorption of precursor molecules on nongrowth surfaces. For example, currently available DoD techniques may use a molecular inhibitor, such as a self-assembled monolayer (SAM), to inhibit deposition of a dielectric material on nongrowth surfaces such as, e.g., a metal or metal oxide surface.

Self-assembled monolayers (SAMs) are organic molecules that form ordered surface monolayer coatings on materials that modify the chemical and physical properties of the material's surface. Some SAM-forming molecules (such as those with thiol, amine or carboxylic acid head groups) assemble selectively on metal versus dielectric materials. For this reason, SAMs have been used in a variety of DoD applications to inhibit dielectric growth on metal surfaces. For example, SAMs have been used to passivate the metal (e.g., copper) lines when fabricating fully self-aligned vias (FSAVs) in the back end of the line (BEOL). The passivation provided by the SAM allows for selective dielectric growth on interlayer dielectric (ILD) patterns by inhibiting dielectric growth on the passivated metal lines.

SUMMARY

The present disclosure provides various embodiments of processes and methods that improve the selectivity of self-assembled monolayers (SAMs) to underlying layers. More specifically, the present disclosure provides improved area-selective deposition (ASD) processes and related methods that reduce or eliminate defects in ASD processes by improving the selectivity of a SAM utilized in the ASD process. In one example embodiment, the processes and methods disclosed herein can be used to prevent edge exclusion defects in a dielectric-on-dielectric (DoD) process by controlling the formation of a SAM selectively deposited onto a conductive surface of a semiconductor substrate.

In the present disclosure, a SAM structure is formed using a spin-on process, which generally includes: (a) a spin coating step for coating a surface of a semiconductor substrate with a liquid solution containing SAM-forming molecules, the semiconductor substrate having a target material and a non-target material exposed on a surface of the semiconductor substrate, (b) an anneal step for heat treating the semiconductor substrate to chemically bond the SAM-forming molecules to the non-target material exposed on the substrate surface, and (c) a rinse step for washing excess liquid solution away from the substrate surface after bonding occurs. In at least one embodiment of the present disclosure, the selectivity of the SAM structure is improved by controlling and/or varying one or more process parameters utilized during the anneal step. For example, the selectivity of the SAM structure is improved by controlling and/or varying the gas(es) utilized during the anneal step, the gas flow rate, the chamber pressure, the anneal temperature and/or the anneal time.

By controlling and/or varying the process parameter(s) utilized during the anneal step, the processes and methods disclosed herein provide a SAM structure that completely covers exposed surfaces of the non-target material, while preventing the SAM structure from extending beyond the boundaries of the non-target material and covering portions of the target material. In some embodiments, the processes and methods disclosed herein may be used to control the formation of a SAM structure utilized in a DoD process. By controlling the formation of the SAM and preventing the SAM from extending beyond the boundaries of the exposed metal surfaces, the methods disclosed herein can reduce or eliminate defects (such as edge exclusion defects) that occur in DoD processes when a dielectric film is subsequently deposited onto the exposed dielectric surfaces of a metal/dielectric pattern. It is recognized, however, that the techniques disclosed herein are not strictly limited to DoD applications and may be used in other ASD processes that utilize SAMs to inhibit growth on non-target materials.

According to one embodiment, a method is provided herein to control formation of a self-assembled monolayer (SAM) structure utilized in an area-selective deposition (ASD) process. In some embodiments, the method may begin by providing a substrate within a process chamber, the substrate having a target material and a non-target material exposed on a surface of the substrate. Next, the method may include forming the SAM structure on an exposed surface of the non-target material by: (a) dispensing a liquid solution onto the surface of the substrate while the substrate is spinning to coat the surface of substrate with the liquid solution, the liquid solution comprising SAM-forming molecules; and (b) heat treating the substrate to chemically bond the SAM-forming molecules to the exposed surface of the non-target material and form the SAM structure on the exposed surface of the non-target material.

The method may further include controlling one or more process parameters used during said heat treating to ensure that the SAM structure completely covers the exposed surface of the non-target material and prevent the SAM structure from extending beyond boundaries of the non-target material and covering portions of the target material. In some embodiments, the method may further include selectively depositing a film on an exposed surface of the target material after forming the SAM structure on the exposed surface of the non-target material. By controlling the one or more process parameters during said heat treating, the method reduces defects in the ASD process by ensuring that the film completely covers the exposed surface of the target material.

According to another embodiment, a method is provided herein to reduce edge exclusion defects in a dielectric-on-dielectric (DoD) process. In some embodiments, the method may begin by providing a substrate within a process chamber, the substrate having a metal layer and a dielectric layer exposed on a surface of the substrate. Next, the method may include selectively depositing a self-assembled monolayer (SAM) structure on an exposed surface of the metal layer by: (a) dispensing a liquid solution onto the surface of the substrate while the substrate is spinning to coat the surface of substrate with the liquid solution, the liquid solution comprising SAM-forming molecules; and (b) heat treating the substrate to chemically bond the SAM-forming molecules to the exposed surface of the metal layer and form the SAM structure on the exposed surface of the metal layer.

The method may further include controlling one or more process parameters used during said heat treating to ensure that the SAM structure completely covers the exposed surface of the metal layer and prevent the SAM structure from extending beyond boundaries of the metal layer and covering portions of the dielectric layer, and selectively depositing a dielectric film on an exposed surface of the dielectric layer after forming the SAM structure on the exposed surface of the metal layer. By controlling the one or more process parameters during said heat treating, the method reduces edge exclusion defects in the DoD process by ensuring that the dielectric film completely covers the exposed surface of the dielectric layer.

The methods disclosed herein may control a wide variety of process parameters during the heat treating (or anneal step) used to form the SAM structure. For example, the one or more process parameters may include one or more of a gas, a gas flow rate, a pressure within the process chamber, a temperature and a time used during the heat treating (or anneal step).

In some embodiments, the one or more process parameters may be controlled by selecting the gas, the gas flow rate, the pressure within the process chamber, the temperature and/or the time to be used during said heat treating based on experimental results. For example, the one or more process parameters may be controlled by selecting: (a) the gas from a group of gases comprising nitrogen ($N_2$), ammonia ($NH_3$), helium (He), and argon (Ar), (b) the gas flow rate from a range of gas flow rates comprising about 4 liters/minute (L/min) to about 7 L/min, (c) the temperature from a range of temperatures comprising about 130° C. to about 180° C., and/or (d) the time from a range of times comprising about 60 seconds to about 180 seconds.

In other embodiments, the one or more process parameters may be controlled by varying one or more of the gas, the gas flow rate, the pressure within the process chamber, the temperature and the time during said heat treating based on a predetermined recipe or based on feedback control. Such varying may occur during an anneal step.

Various embodiments of methods are provided herein for controlling the formation of a SAM structure utilized in an ASD process, and thus, reducing defects in the ASD process. Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this Summary Section does not specify every embodiment and/or incrementally novel aspect of the present disclosure or claimed inventions. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

FIG. 8 is a flowchart diagram illustrating one embodiment of a method to control formation of a SAM structure utilized in an area-selective deposition (ASD) process in accordance with the present disclosure.

FIG. 9 is a flowchart diagram illustrating another embodiment of a method to reduce edge exclusion defects in a dielectric-on-dielectric (DoD) process in accordance with the present disclosure.

DETAILED DESCRIPTION

Selective dielectric-on-dielectric growth is one approach that may be used to ensure reliability when fabricating fully self-aligned vias (FSAVs) in the back end of the line (BEOL). Currently available dielectric-on-dielectric (DoD) processes use self-assembled monolayers (SAMs) to passivate the metal surfaces (e.g., copper lines) in metal/dielectric patterns and allow for selective dielectric growth on the interlayer dielectric (ILD). In conventional DoD processes, a SAM structure is formed on the metal surfaces of a metal/dielectric pattern to enable area selective DoD by inhibiting dielectric growth on the metal surfaces. DoD is typically performed using vapor deposition methods, such as chemical vapor deposition (CVD) and atomic layer deposition (ALD). In such methods, the SAM structure inhibits dielectric growth on the metal surfaces by preventing the dielectric precursor used during the vapor deposition process from reaching the metal surface.

Figure 1A:
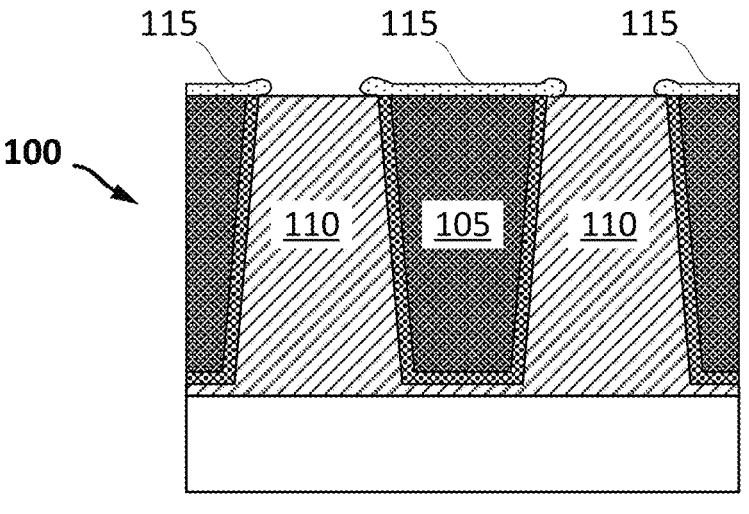
FIGS. 1A-1C illustrate an example dielectric-on-dielectric (DoD) process that utilizes a self-assembled monolayer (SAM) to inhibit dielectric growth on a metal surface.
Figure 1B:
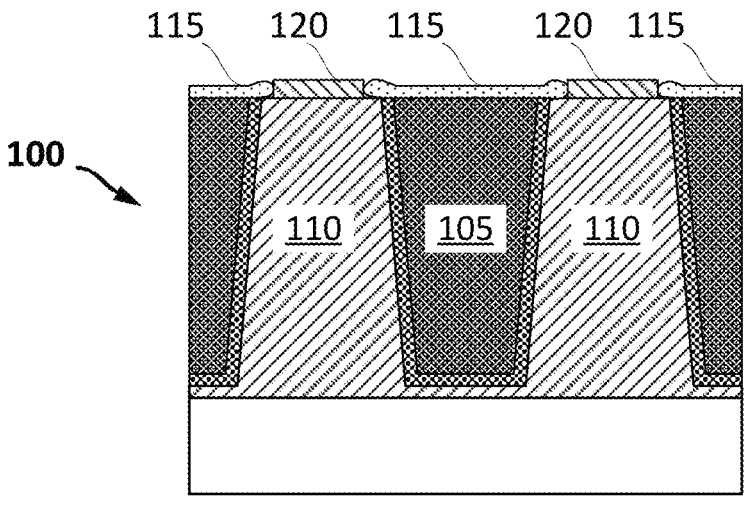
Figure 1C:
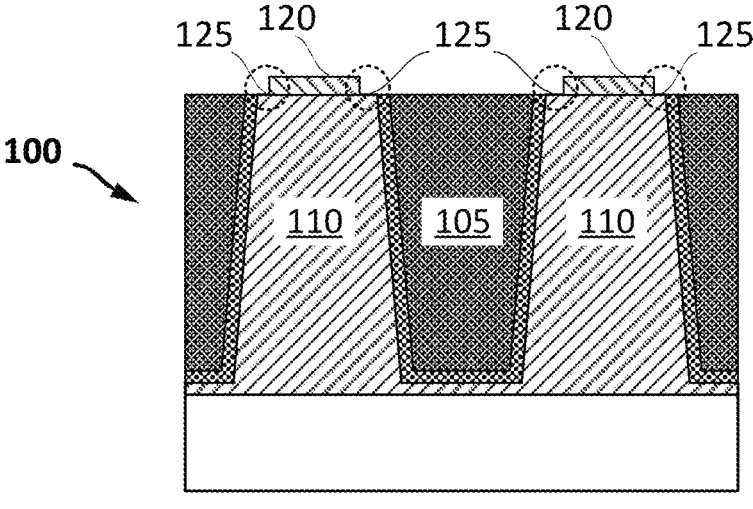

FIGS. 1A-1C illustrate an example DoD process that utilizes a SAM to inhibit dielectric growth on a metal surface. As shown in FIG. 1A, substrate 100 includes a metal feature 105 (e.g., a metal line) formed within a dielectric pattern 110. A SAM 115 is formed on the metal feature 105 in FIG. 1A to inhibit dielectric growth on the exposed surface of the metal feature 105 when a deposition process is subsequently performed in FIG. 1B to selectively deposit a dielectric material 120 on the dielectric pattern 110.

A wide variety of deposition techniques can be used to selectively deposit the SAM 115 on the metal feature 105 shown in FIG. 1A. For example, the SAM 115 may be selectively deposited onto the metal feature 105 using a variety of wet and dry deposition processes including, but not limited to, immersion, dip-coating, spin-coating and chemical vapor deposition (CVD). Unfortunately, current processes used to form self-assembled monolayers (such as the SAM 115 shown in FIG. 1A) often fail to provide sufficient selectivity between the SAM and the underlying layers. As shown in FIG. 1A, for example, the SAM 115 deposited onto the metal feature 105 extends beyond the edges of the metal feature 105 to cover at least a portion of the dielectric pattern 110 surface. When the dielectric material 120 is subsequently deposited onto the dielectric pattern 110 in FIG. 1B, the SAM 115 inhibits growth of the dielectric material 120 on the edges of the dielectric pattern 110, resulting in edge exclusion defects 125, as shown in FIG. 1C.

The present disclosure provides various embodiments of processes and methods that improve the selectivity of self-assembled monolayers (SAMs) to underlying layers to overcome the problems shown in FIGS. 1A-1C. More specifically, the present disclosure provides improved area-selective deposition (ASD) processes and related methods that reduce or eliminate defects in ASD processes by improving the selectivity of a SAM utilized in the ASD process. In one example embodiment, the processes and methods disclosed herein can be used to prevent edge exclusion defects in a dielectric-on-dielectric (DoD) process by controlling the formation of a SAM selectively deposited onto a conductive surface of a semiconductor substrate.

In the present disclosure, a SAM structure is formed using a spin-on process, which generally includes: (a) a spin coating step for coating a surface of a semiconductor substrate with a liquid solution containing SAM-forming molecules, the semiconductor substrate having a target material and a non-target material exposed on a surface of the semiconductor substrate, (b) an anneal step for heat treating the semiconductor substrate to chemically bond the SAM-forming molecules to the non-target material exposed on the substrate surface, and (c) a rinse step for washing excess liquid solution away from the substrate surface after bonding occurs. In at least one embodiment of the present disclosure, the selectivity of the SAM structure is improved by controlling and/or varying one or more process parameters utilized during the anneal step. For example, the selectivity of the SAM structure is improved by controlling and/or varying the gas(es) utilized during the anneal step, the gas flow rate, the chamber pressure, the anneal temperature and/or the anneal time.

By controlling and/or varying the process parameter(s) utilized during the anneal step, the processes and methods disclosed herein provide a SAM structure that completely covers exposed surfaces of the non-target material, while preventing the SAM structure from extending beyond the boundaries of the non-target material and covering portions of the target material. In some embodiments, the processes and methods disclosed herein may be used to control the formation of a SAM structure utilized in a DoD process. By controlling the formation of the SAM and preventing the SAM from extending beyond the boundaries of the exposed metal surfaces, the methods disclosed herein can reduce or eliminate defects (such as edge exclusion defects) that may otherwise occur in a DoD process when a dielectric film is subsequently deposited onto the exposed dielectric surfaces of a metal/dielectric pattern. It is recognized, however, that the techniques disclosed herein are not strictly limited to DoD applications and may be used in other ASD processes that utilize SAMs to inhibit growth on non-target materials.

Figure 2A:
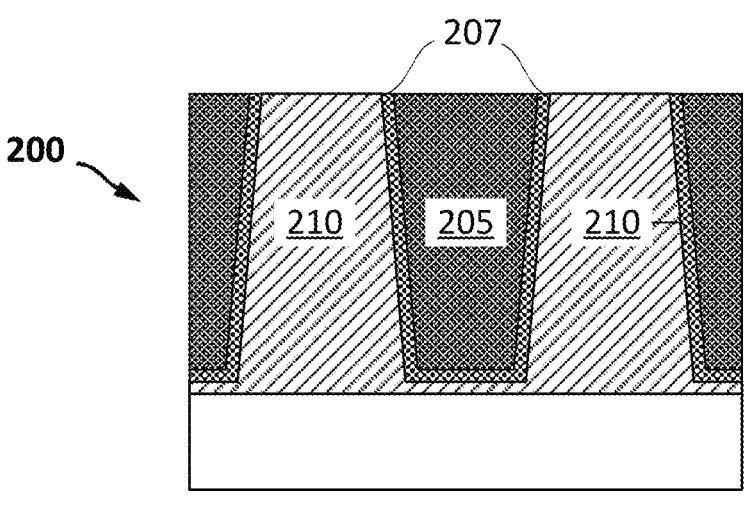
FIGS. 2A-2C illustrate one embodiment of an improved dielectric-on-dielectric (DoD) process that utilizes the techniques described herein to selectively deposit a SAM structure on a metal surface with improved selectivity to the metal surface.
Figure 2B:
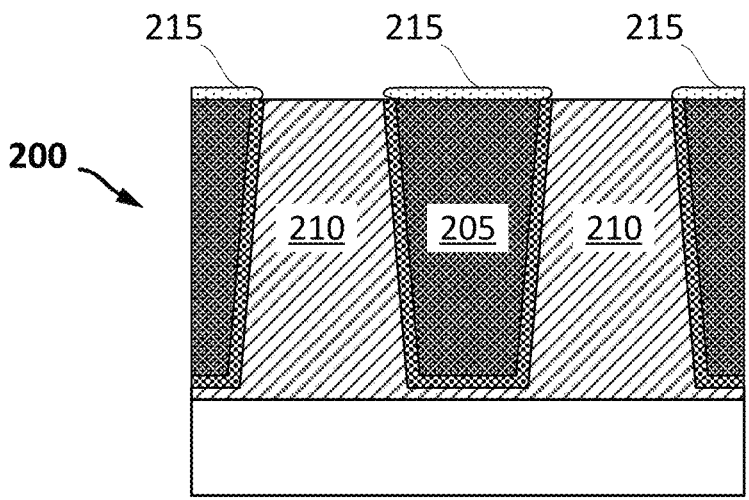
Figure 2C:
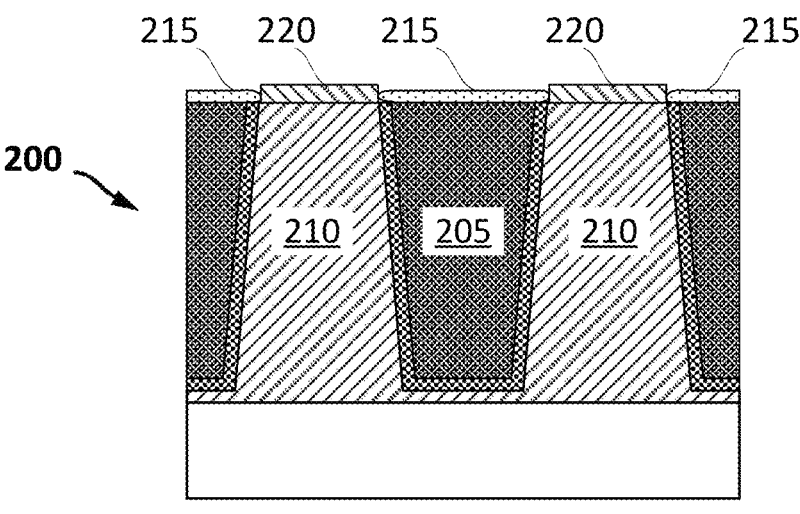

Returning to the drawings, FIGS. 2A-2C illustrate one embodiment of an area-selective deposition (ASD) process that utilizes the techniques disclosed herein to selectively deposit a self-assembled monolayer (SAM) on a non-target material with improved selectivity to the non-target material. More specifically, FIGS. 2A-2C illustrate an improved dielectric-on-dielectric (DoD) process that utilizes the techniques disclosed herein to selectively deposit a SAM structure on a surface of a non-target material (e.g., a metal or metal oxide material), while avoiding SAM deposition on target material(s), such as dielectric materials provided on the same substrate. In some embodiments, the DoD process shown in FIGS. 2A-2C may improve the selectivity of the deposited SAM by controlling or varying one or more process parameters used during the anneal step used to form the SAM structure, as shown and described in reference to FIG. 3. Although described in the context of a DoD application, it is recognized that the process shown in FIGS. 2A-2C is merely one example application of the techniques described herein.

FIGS. 2A-2C illustrate an improved ASD process that can be used to selectively deposit a dielectric film on a dielectric material in accordance with the present disclosure. In the embodiment shown in FIG. 2A, a semiconductor substrate 200 is provided with a metal/dielectric pattern having a metal layer 205, a metal liner layer 207 and a dielectric layer 210 exposed on a surface of the semiconductor substrate 200. The metal liner layer 207 is provided between the metal layer 205 and dielectric layer 210 as a protective barrier layer to prevent diffusion of the metal into the dielectric layer 210.

The metal layer 205 may include a wide variety of metal-containing materials, such as but not limited to, copper (Cu), ruthenium (Ru), cobalt (Co), tungsten (W), molybdenum (Mo) and oxides thereof. The metal liner layer 207 may also include a wide variety of metal-containing materials, such as but not limited to, titanium (Ti), titanium nitride (TiN), tantalum (Ta), tantalum nitride (TaN), tungsten (W), tungsten nitride (WN), cobalt (Co), ruthenium (Ru), ruthenium tantalum (RuTa), etc. The metal layer 205 and metal liner layer 207 may also include other conductive materials commonly used in integrated circuit (IC) fabrication, as is known in the art. Depending on the conductive materials used, exposed surfaces of the metal layer 205 and metal liner layer 207 may be terminated with various metal, metal oxide or metal nitride surface groups.

The dielectric layer 210 may include a wide variety of dielectric materials, including but not limited to, oxides, silicon oxides and other low-k and high-k dielectric materials commonly used in IC fabrication. In one example embodiment, dielectric layer 210 may be a low-k dielectric such as, but not limited to, a low-k silicon oxycarbide (SiCOH) dielectric layer. Depending on the dielectric material used, the surface of the dielectric layer 210 may be terminated with —O, —H or —OH surface groups.

In the embodiment shown in FIG. 2B, a SAM structure 215 is formed on exposed surfaces of the metal layer 205 and the metal liner layer 207 to modify the chemical and/or physical surface properties of the metal layers and form a SAM-passivated metal, metal oxide or metal nitride. As known in the art, SAM-forming molecules consist of a head group, a tail group (or polymer chain) and a functional end group. Self-assembled monolayers (or SAMs) are created by the chemisorption of the head groups onto a non-target surface (e.g., a metal surface in DoD applications), either through vapor or liquid phase deposition, followed by a slow organization of the tail groups. Because the head groups have high chemical affinity to the non-target surface, they assemble together on the non-target surface, while the tail groups assemble away from the non-target surface. Areas of closely packed SAM-forming molecules nucleate and grow until the non-target surface is covered in a single self-assembled monolayer, such as SAM structure 215. Common head groups include thiols, amines, carboxylic acids, silanes, phosphonates, etc. As noted above, SAM-forming molecules having thiol, amine and carboxylic acid head groups are known for having high chemical affinity to metals, and thus, may be used to selectively assemble on the exposed surfaces of the metal layer 205 and metal liner layer 207 to form the SAM structure 215 shown in FIG. 2B. In one example embodiment, a SAM structure 215 with a thiol, silane, phosphate, amine or carboxylic acid head group and a hydrocarbon tail group may be formed on the exposed surfaces of the metal layer 205 and the metal liner layer 207 via spin-on deposition. However, the SAM structure 215 may also include other head groups and/or tail groups, as is known in the art.

Figure 3:
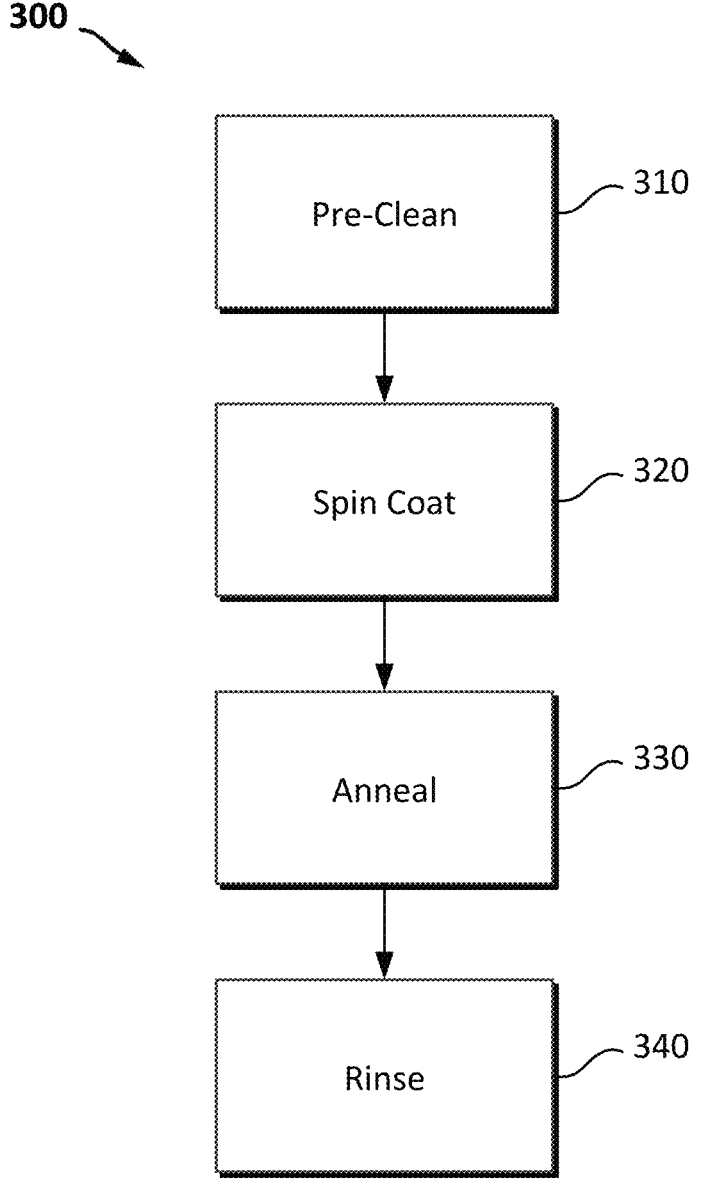
FIG. 3 illustrates one embodiment of a spin-process that can be used to form the SAM structure shown in FIG. 2B.
Figure 4A:
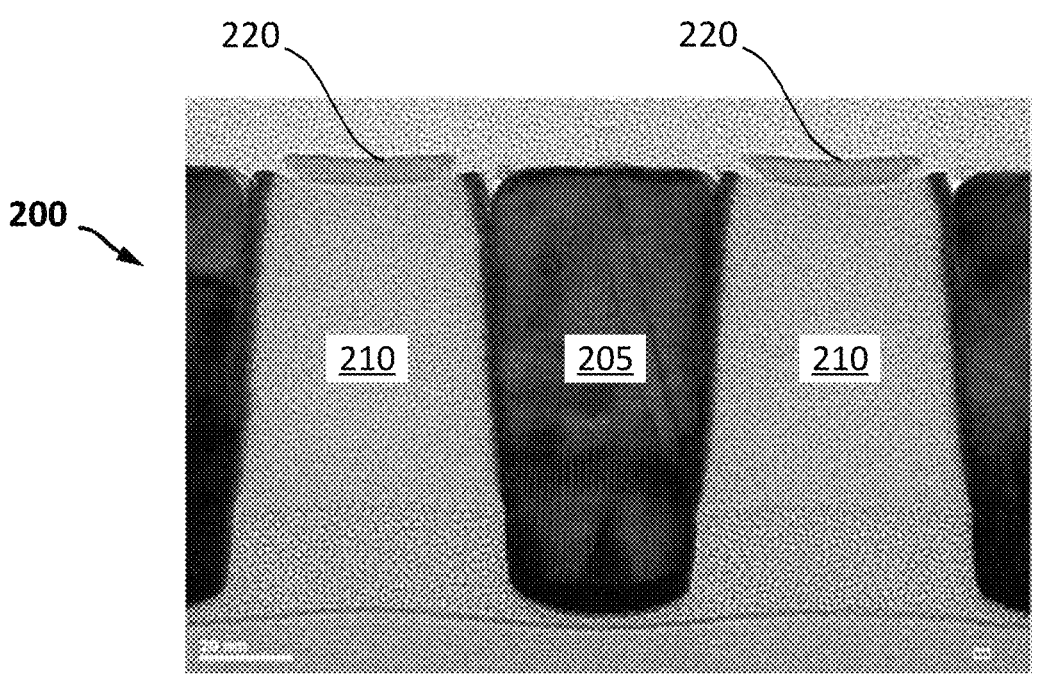
FIGS. 4A-4D are scanning electron microscope (SEM) images of a semiconductor substrate after the DoD process shown in FIGS. 2-3 is performed, illustrating different results obtained by varying the gas flow rate during the anneal step shown in FIG. 3.
Figure 4B:
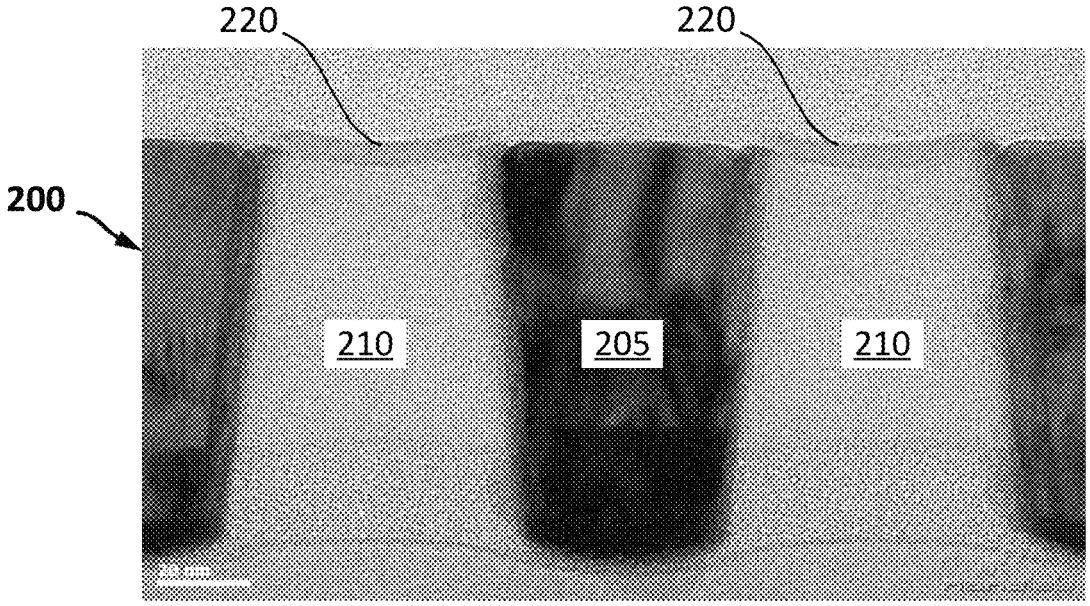
Figure 4C:
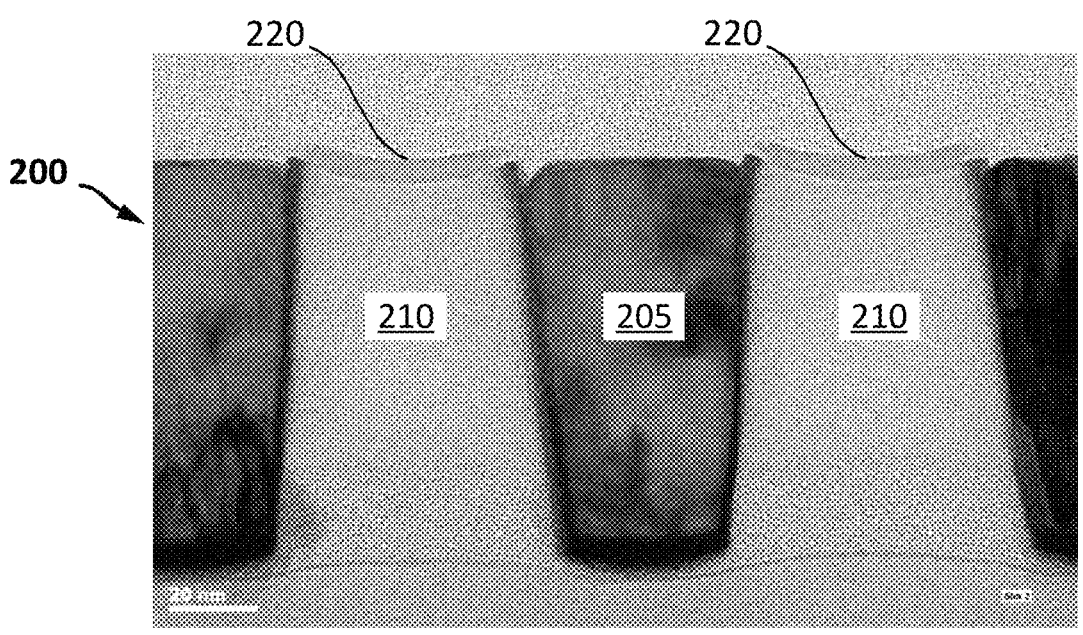
Figure 4D:
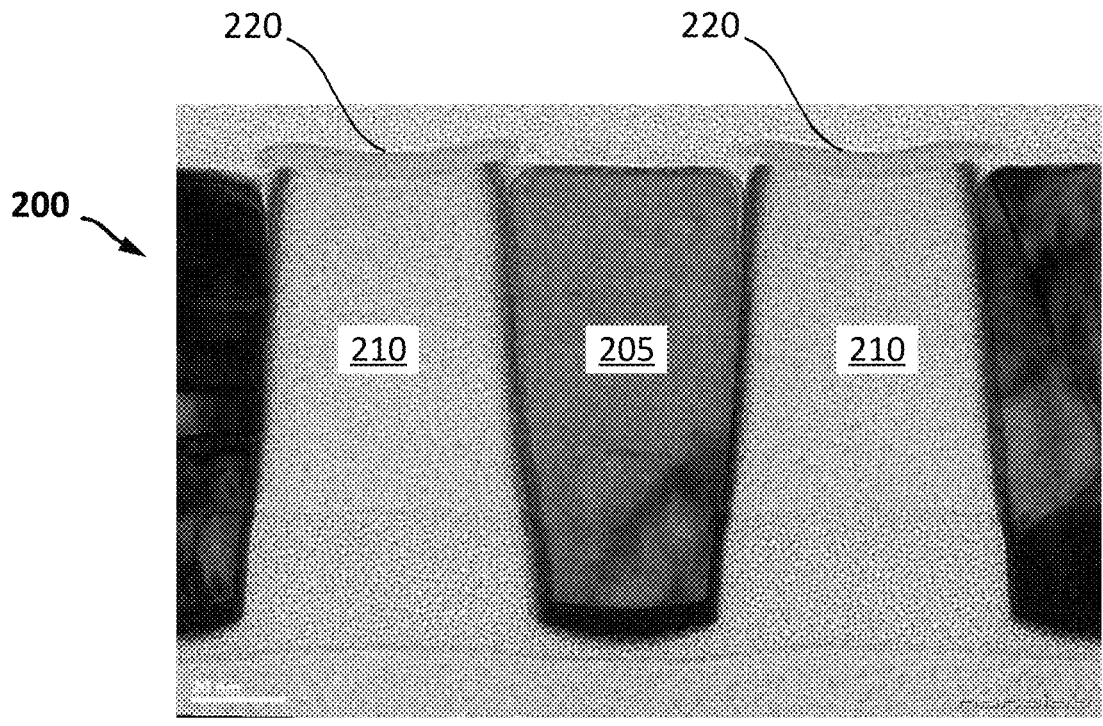
Figures 5A, 5B, 5C, 5D:
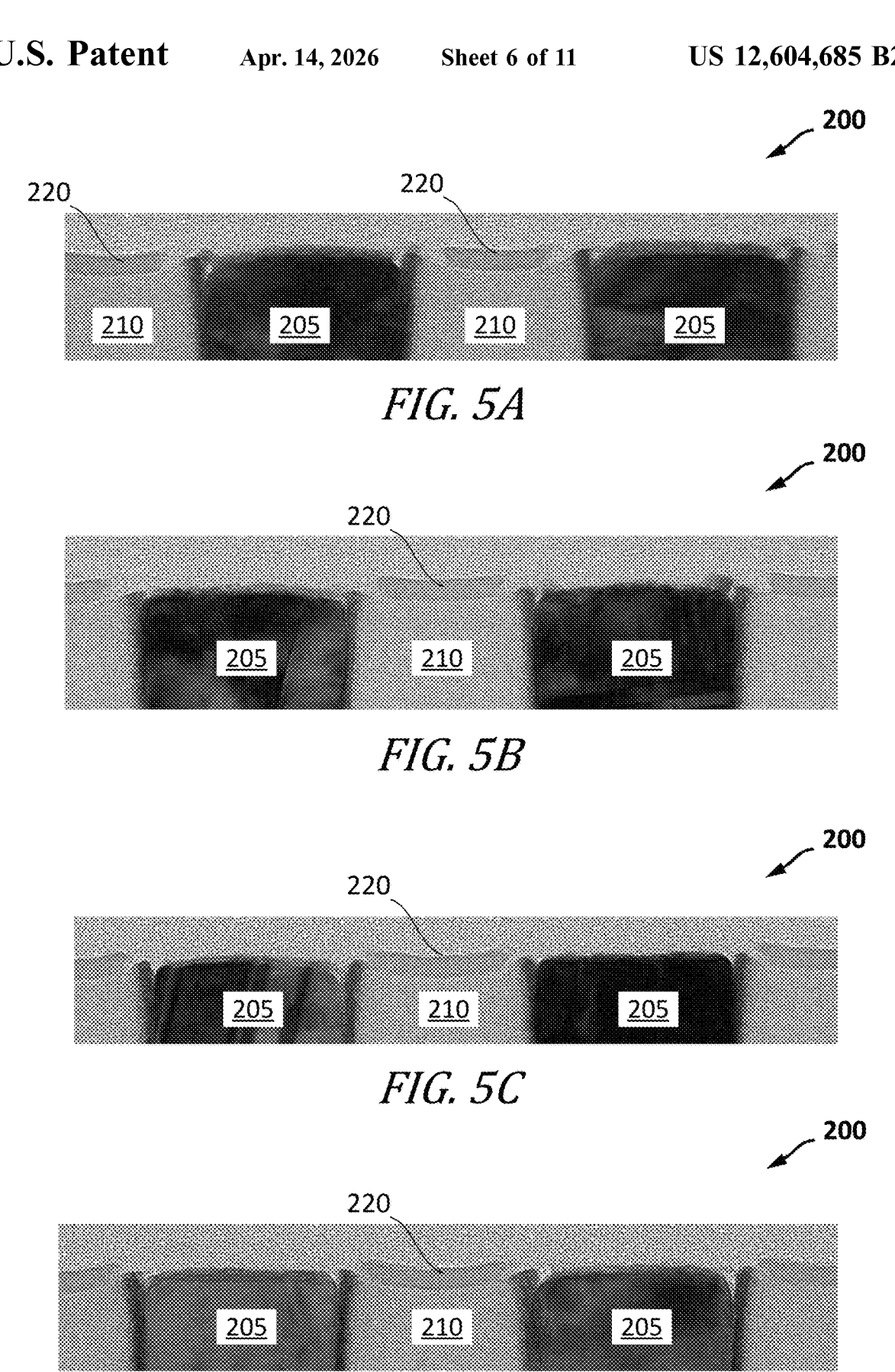
FIGS. 5A-5H are SEM images of the semiconductor substrate after the DoD process shown in FIGS. 2-3 is performed, illustrating different results obtained by varying the temperature utilized during the anneal step shown in FIG. 3.
Figures 5E, 5F, 5G, 5H:
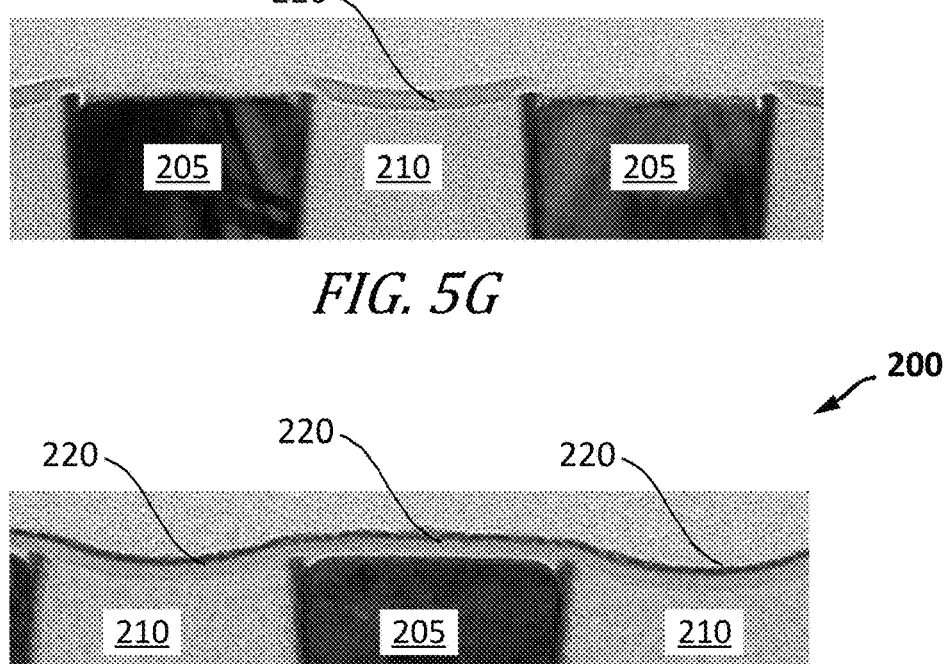

FIG. 3 illustrates an example spin-on process 300 that can be used to form the SAM structure 215 shown in FIG. 2B. In some embodiments, the spin-on process 300 may begin by pre-cleaning the surface of the semiconductor substrate 200 (in step 310) to remove surface contaminants. The surface of the semiconductor substrate 200 may be pre-cleaned in step 310 by applying a cleaning solution onto the surface of the semiconductor substrate 200 while the substrate is spinning or stationary. In one example, the cleaning solution may include citric acid and deionized water. Other cleaning solutions may also be used in step 310 to clean the substrate surface.

After pre-cleaning, a liquid solution containing SAM-forming molecules (i.e., a SAM-forming solution) is applied to the surface of the semiconductor substrate 200 in a spin-coating step (in step 320). During the spin-coating step, the substrate may be rotated at a rotational speed (for example, 500 to 3000 rotations per minute, RPM) to ensure that the SAM-forming solution evenly coats the substrate surface. The SAM-forming molecules within the SAM-forming solution applied to the substrate surface in step 320 chemically bond to the surface group(s) on the non-target surface(s) of the semiconductor substrate 200. The SAM-forming molecules nucleate and grow to cover the non-target surface(s) and form a self-assembled monolayer. The SAM-forming molecules are selected such that they bond to the non-target surface(s). In the example embodiment shown in FIG. 2B, the SAM-forming solution applied in step 320 contains SAM-forming molecules having thiol, silane, phosphate, amine or carboxylic acid head groups, which selectively assemble on the exposed surfaces of the metal layer 205 and the metal liner layer 207 to selectively deposit the SAM structure 215 thereon.

A wide variety of SAM-forming solutions may be used during the spin-coating step. For example, a SAM-forming solution comprising a SAM precursor dissolved in an organic solvent may be used to form the SAM structure 215 shown in FIG. 2B. The SAM precursor may include various thiols, silanes, phosphates, carboxylic acids, amines, etc. Examples of suitable organic solvents include, but are not limited to, propylene glycol methyl ether acetate (PGMEA), propylene glycol methyl ether (PGME), methyl isobutyl ketone (MIBK), methyl isobutyl carbinol (MIBC), propanol, ethanol, ethyl lactate and other alcohols. In some embodiments, a SAM precursor dissolved in PGMEA may be used during the spin-coating step to form a SAM structure 215 having a thiol, silane, phosphate, carboxylic or amine head group that selectively adheres to exposed surfaces of the metal layer 205 and the metal liner layer 207, and a hydrocarbon polymer tail group that provides a hydrophobic barrier against the dielectric precursors or co-reactants subsequently used to selectively deposit a dielectric film 220 onto exposed surfaces of the dielectric layer 210, as shown in FIG. 2C and described in more detail below. However, the SAM structure 215 shown in FIG. 2B is not strictly limited to hydrocarbon polymer tail groups, and may include other polymers that can be deposited via spin-on and provide a barrier against the dielectric film 220.

After applying the SAM-forming solution to the surface of the semiconductor substrate 200 (in step 320), an anneal step is performed (in step 330) to provide the activation energy required to chemically bond the functional head groups of the SAM-forming molecules to the surface groups on the non-target surface(s), thereby forming the SAM structure 215 on the non-target surface(s). After the anneal step, a rinse step is performed (in step 340) to wash excess SAM-forming solution away from the substrate surface. In one embodiment, propylene glycol monomethyl ether acetate (PGMEA) may be applied to the surface of the semiconductor substrate 200 in the rinse step (in step 340). A rinse solution (such as PGMEA) removes the SAM-forming molecules that have not bonded to the non-target surface(s) without disturbing the SAM structure 215 formed on the non-target surface(s). Other rinse solutions may also be used in step 340.

The anneal step may be performed (in step 330) within the same processing chamber used to perform the pre-cleaning, spin-coating and rinse steps, or within a different processing chamber. During the anneal step, one or more processing parameters may be controlled and/or varied to ensure that the SAM structure 215 completely covers the exposed surfaces of the non-target materials (e.g., the metal layer 205 and the metal liner layer 207) without extending beyond the boundaries of the non-target materials and covering portions of the target material (e.g., the dielectric layer 210). For example, the gas(es) utilized during the anneal step, the gas flow rate, the chamber pressure, the anneal temperature and/or the anneal time may be individually controlled and/or varied during the anneal step to improve the selectivity of the SAM structure to the non-target material.

A wide variety of gas(es), gas flow rates, chamber pressures, anneal temperatures and/or anneal times may be utilized during the anneal step (in step 330). In some embodiments, nitrogen ($N_2$), ammonia ($NH_3$) or other gases (such as, for example but not limited to, helium (He) or argon (Ar)) may be supplied to the processing chamber at a gas flow rate of about 4-7 liters/minute (L/min) during the anneal step. The anneal temperature between about 130° C. and about 180° C., and the anneal time between about 60 to 180 seconds, may also be used during the anneal step.

After forming the SAM structure 215 as shown and described in FIGS. 2B and 3, a dielectric film 220 is selectively deposited onto exposed surfaces of the dielectric layer 210 in the embodiment shown in FIG. 2C. The dielectric film 220 may include a wide variety of dielectric materials, including but not limited to, oxides, silicon oxides and other low-k and high-k dielectric materials commonly used in IC fabrication. In one example embodiment, the dielectric film 220 may be a high-k dielectric such as, but not limited to, aluminum oxide ($Al_2O_3$). Although a wide variety of deposition processes may be used to selectively deposit the dielectric film 220 onto the dielectric layer 210, the dielectric film 220 is preferably deposited via CVD or ALD using a dielectric precursor. The SAM structure 215 formed on the metal layer 205 and the metal liner layer 207 inhibits dielectric growth on the metal surfaces by preventing the dielectric precursor from reaching the metal surfaces. In some embodiments, the hydrophobic nature of the SAM tails may also repel water, which is a co-reactant commonly used in oxide ALD recipes.

The ASD process shown in FIGS. 2-3 and described above provides a variety of advantages. Unlike the DoD process shown in FIGS. 1A-1C, for example, the DoD process shown in FIGS. 2-3 provides a SAM structure 215 with improved selectivity to metal surfaces exposed on the semiconductor substrate. As noted above, the SAM structure 215 formed in FIGS. 2B and 3 completely covers the exposed metal surfaces (e.g., the exposed surfaces of the metal layer 205 and the metal liner layer 207) without extending beyond boundaries of the metal surfaces to encroach upon and cover portions of the exposed dielectric surfaces (e.g., the exposed surfaces of the dielectric layer 210). By improving the selectivity of the SAM structure 215 to the exposed metal surfaces, the ASD process shown in FIGS. 2-3 eliminates the edge exclusion defects shown in FIG. 1C by providing a dielectric film 220 that completely covers the underlying dielectric layer 210, as shown in FIG. 2C.

As noted above, SAM selectivity is improved in the present disclosure by controlling and/or varying one or more processing parameters utilized during the anneal step shown in FIG. 3. Experiments were conducted to determine optimal processing parameters that can be used during the anneal step shown in FIG. 3 to improve SAM selectivity to metal surfaces exposed on the substrate. FIGS. 4A-4D, FIGS. 5A-5H and FIGS. 6A-6C illustrate experimental results obtained by varying the gas flow rate, the anneal temperature and the anneal time, respectively.

FIGS. 4A-4D are scanning electron microscope (SEM) images of the semiconductor substrate 200 after the DoD process shown in FIGS. 2-3 is performed, illustrating different results obtained by varying the gas flow rate during the anneal step shown in FIG. 3. In the embodiments shown in FIGS. 4A-4D, nitrogen ($N_2$) gas is supplied to the processing chamber during the anneal step at variable gas flow rates. Specifically, $N_2$ gas is supplied at a gas flow rate of 1 L/min in FIG. 4A, 4 L/min in FIG. 4B, 7 L/min in FIG. 4C and 9.5 L/min in FIG. 4D. The experimental results shown in FIGS. 4A-4C indicate that increasing the gas flow rate (for example, up to about 7 L/min) reduces edge exclusion defects in the dielectric film 220 without degrading selectivity. The experimental result shown in FIG. 4D, on the other hand, shows that increasing the $N_2$ gas flow rate to 9.5 L/min decreases selectivity, enabling dielectric film 220 to be deposited onto portions of the exposed metal surfaces. Thus, in some embodiments, an $N_2$ gas flow rate of about 4-7 L/min may be used during the anneal step shown in FIG. 3 to reduce or eliminate edge exclusion defects in a DoD process. Although not explicitly shown and described herein, similar results may be obtained by increasing the pressure within the processing chamber.

FIGS. 5A-5H are SEM images of the semiconductor substrate 200 after the DoD process shown in FIGS. 2-3 is performed, illustrating different results obtained by varying the temperature utilized during the anneal step. In the embodiments shown in FIGS. 5A-5H, nitrogen ($N_2$) gas is supplied to the processing chamber at a specified gas flow rate (for example, 1 L/min) for 180 seconds and the temperature utilized during the anneal step is varied. In the illustrated results, the temperature used during the anneal step is 180° C. in FIG. 5A, 150° C. in FIG. 5B, 145° C. in FIG. 5C, 140° C. in FIG. 5D, 135° C. in FIG. 5E, 130° C. in FIG. 5F, 125° C. in FIG. 5G and 120° C. in FIG. 5H. The experimental results shown in FIGS. 5A-5F indicate that decreasing the anneal temperature (for example, down to about 130° C.) reduces edge exclusion defects in the dielectric film 220 without degrading selectivity. The experimental results shown in FIGS. 5G-5H, on the other hand, show that lowering the anneal temperature below 130° C. decreases selectivity, enabling dielectric film 220 to be deposited onto portions of exposed metal surfaces. Thus, in some embodiments, an anneal temperature between about 130-145° C. and an anneal time of 180 seconds may be utilized during the anneal step to reduce or eliminate edge exclusion defects in a DoD process.

Figure 6A:
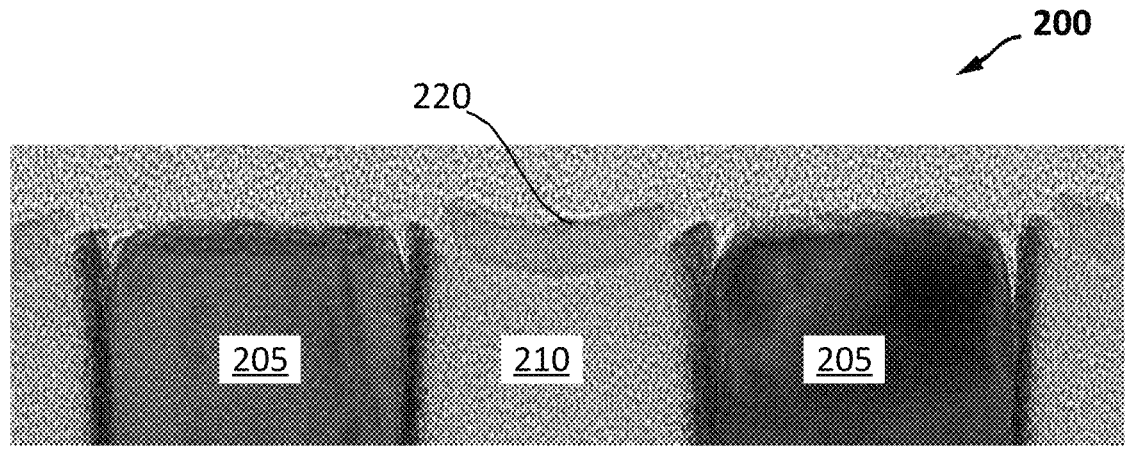
FIGS. 6A-6C are SEM images of the semiconductor substrate 200 after the DoD process shown in FIGS. 2-3 is performed, illustrating different results obtained by varying the anneal time utilized during the anneal step shown in FIG. 3.
Figure 6B:
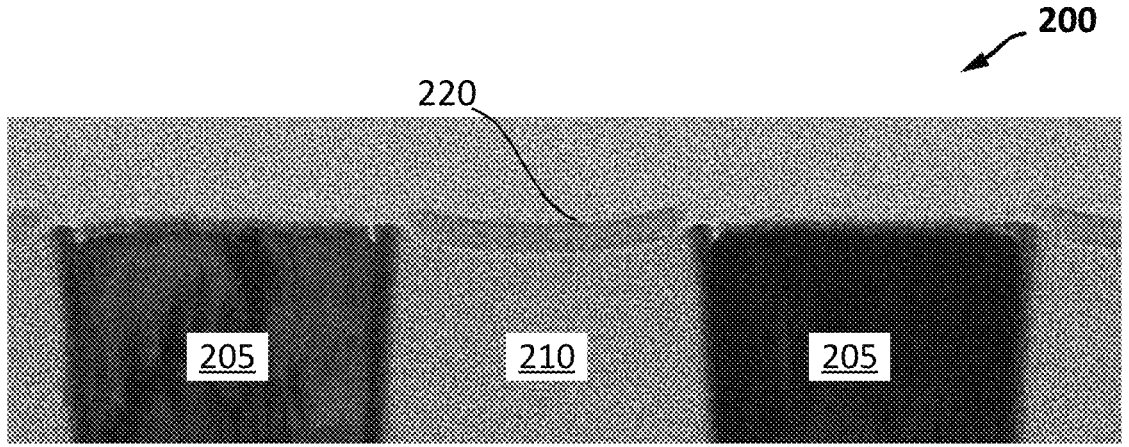
Figure 6C:
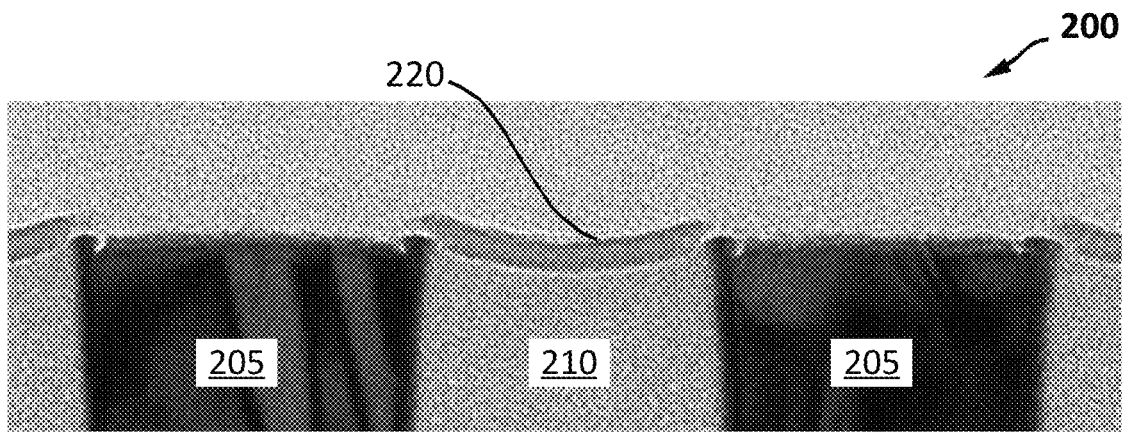

FIGS. 6A-6C are SEM images of the semiconductor substrate 200 after the DoD process shown in FIGS. 2-3 is performed, illustrating different results obtained by varying the anneal time utilized during the anneal step. In the embodiments shown in FIGS. 6A-6C, nitrogen ($N_2$) gas is supplied to the processing chamber at specified gas flow rate (for example, 7 L/min) during the anneal step. The anneal temperature is held constant (for example, at 140° C.), while the anneal time is varied. In the illustrated results, the semiconductor substrate 200 is annealed (or baked) for 180 seconds in FIG. 6A, 120 seconds in FIG. 6B and 60 seconds in FIG. 6C. As shown in FIGS. 6A-6C, decreasing the anneal time from 180 seconds to 60 seconds reduces edge exclusion defects in the dielectric film 220 without degrading selectivity. Thus, in some embodiments, an anneal temperature of about 140° C. and an anneal time of about 60 seconds may be used during the anneal step to reduce or eliminate edge exclusion defects in a DoD process.

Because the anneal temperature and the anneal time are inversely related, acceptable results may also be obtained by decreasing the anneal temperature and increasing the anneal time, or alternatively, by increasing the anneal temperature and decreasing the anneal time. In some embodiments, an anneal temperature between about 130-180° C. and an anneal time between about 60-180 seconds may be used during the anneal step to reduce or eliminate edge exclusion defects in a DoD process.

In some embodiments of the present disclosure, the processing parameters for the anneal step (for example, the gas(es) utilized during the anneal step, the gas flow rate, the chamber pressure, the anneal temperature and/or the anneal time) may be selected based on experimental results and utilized during the anneal step to improve SAM selectivity and reduce/eliminate defects in the DoD process. The process parameters selected based on the experimental results result in processing conditions that are effective in forming a SAM structure, which completely covers the non-target surface(s) without covering portions of the target surface. The process parameters and processing conditions described herein can be optimized to produce the desired results using the methodology described herein.

In other embodiments of the present disclosure, one or more of the processing parameters (for example, the gas(es) utilized during the anneal step, the gas flow rate, the chamber pressure, the anneal temperature and/or the anneal time) may be varied during the anneal step based on a predetermined recipe or based on feedback control. For example, a higher anneal temperature may be initially used at the beginning of the anneal step to achieve the activation energy needed to ensure chemical bonding between the SAM-forming molecules and the exposed metal surfaces, thereby improving SAM selectivity to the exposed metal surfaces. As annealing continues, the anneal temperature may be decreased to reduce/eliminate defects in the DoD process. In another example, the anneal temperature may initially start low, gradually ramp up and end high to improve SAM selectivity and reduce/eliminate defects in the DoD process. In yet another example, the anneal temperature may vary in a low-high-low pattern during the anneal process.

The ASD processes described herein may be utilized within a wide variety of applications. For example, the ASD process shown in FIGS. 2-3 may be used to provide selective dielectric-on-dielectric (DoD) deposition with reduced or eliminated edge exclusion defects in patterns of interlayer dielectric (ILD) and metal lines. The ASD process shown and described herein improves SAM selectivity to underlying metal layers, such as copper (Cu) lines, by controlling and/or varying one or more processing parameters used in the anneal process shown in FIG. 3. Similar selectivity is expected for other metal-containing surfaces, such as but not limited to, ruthenium (Ru), cobalt (Co), tungsten (W), molybdenum (Mo) and oxides and nitrides thereof.

By controlling and/or varying the process parameter(s) used during the anneal, the DoD processes disclosed herein provide a SAM structure that completely covers exposed metal surfaces, while preventing the SAM structure from extending beyond the boundaries of the metal surfaces and covering portions of the dielectric surfaces. In some embodiments, the DoD processes disclosed herein may be used to reduce or eliminate defects (such as edge exclusion defects) that may otherwise occur in a DoD process when a dielectric film is selectively deposited on exposed dielectric surfaces of a metal/dielectric pattern. It is recognized, however, that the techniques disclosed herein are not strictly limited to DoD processes and may be used in other ASD processes that utilize SAMs to inhibit growth on various surfaces. Other advantages and alternative uses for the techniques described herein may be apparent to one skilled in the art.

The ASD processes described herein can be performed within a wide variety of semiconductor processing chambers, modules and/or systems. In some embodiments, a spin-processing system may be used to selectively deposit the SAM structure 215 on exposed metal surfaces of a metal/dielectric pattern. The dielectric film 220 may be subsequently deposited on exposed dielectric surfaces of the metal/dielectric pattern using a variety of wet and dry techniques. In some embodiments, the dielectric film 220 may be formed within the same processing chamber used to form the SAM structure 215. In other embodiments, the dielectric film 220 may be formed using a variety of vapor deposition techniques (such as CVD or ALD), and thus, may be transferred to a different processing chamber after the SAM structure 215 is formed.

Figure 7:
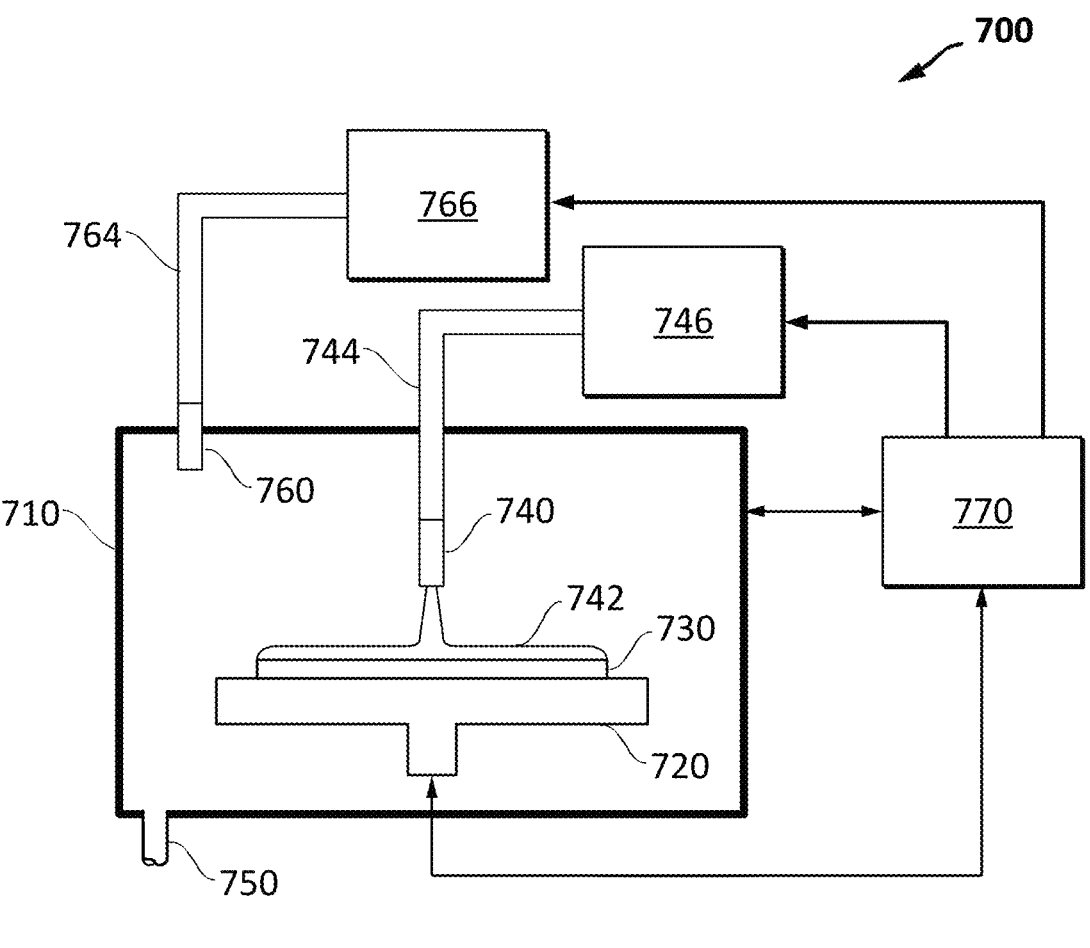
FIG. 7 is a block diagram of an example processing system that can be used to perform the spin-on process shown in FIG. 3.

FIG. 7 illustrates one embodiment of a spin-processing system 700 that may use the techniques described herein to selectively deposit a self-assembled monolayer on a substrate surface, such as the SAM structure 215 shown and described in FIGS. 2B and 3. As shown in FIG. 7, the spin-processing system 700 includes a process chamber 710, which in some embodiments, may be a pressure controlled chamber. In the embodiment shown in FIG. 7, the process chamber 710 is a spin chamber having a spinner 720 (or spin chuck), which is configured to spin or rotate at a specified rotational speed. A substrate 730 is held on the spinner 720, for example, via electrostatic force or vacuum pressure. As noted above, the substrate 730 may be a semiconductor wafer having a target material and a non-target material exposed on a surface of the substrate 730. In one example embodiment, the substrate 730 may have a metal/dielectric pattern formed on or within the substrate 730, and thus, may have a metal material and a dielectric material exposed on the surface of the substrate 730.

The spin-processing system 700 shown in FIG. 7 further includes a liquid nozzle 740, which is positioned over the substrate 730 for dispensing various liquid solutions 742 onto a surface of the substrate 730. The liquid solutions 742 dispensed onto the surface of the substrate 730 may generally include a cleaning solution, a SAM-forming solution and a rinse solution. Examples of cleaning solutions, SAM-forming solutions and rinse solutions are discussed above.

As shown in FIG. 7, the liquid solutions 742 may be stored within a chemical supply system 746, which may include one or more reservoirs for holding the various liquid solutions 742 and a chemical injection manifold, which is fluidly coupled to the spin-processing system 700 via a liquid supply line 744. In operation, the chemical supply system 746 may selectively apply desired chemicals to the process chamber 710 via the liquid supply line 744 and the liquid nozzle 740 positioned within the process chamber

710. Thus, the chemical supply system 746 can be used to dispense the liquid solutions 742 onto the surface of the substrate 730. The process chamber 710 may further include a drain 750 for removing the liquid solutions 742 from the process chamber 710.

The spin-processing system 700 shown in FIG. 7 further includes a gas nozzle 760, which is positioned over the substrate 730 for dispensing various gases into the process chamber 710. A wide variety of gases may be dispensed into the process chamber 710 when forming the SAM structure 215. For example, nitrogen ($N_2$), ammonia ($NH_3$) or other gases (such as, for example, helium (He) and argon (Ar)) may be dispensed into the process chamber 710 at a gas flow rate ranging between about 4-7 liters/minute (L/min) during the anneal step, as discussed above. In some embodiments, the gas(es) and/or gas flow rates of the gas(es) dispensed into the process chamber 710 may be controlled and/or varied to control the selectivity of the SAM structure 215, as further discussed above.

As shown in FIG. 7, the gas(es) may be stored within a gas supply system 766, which may include one or more reservoirs for holding the gas(es) and a gas injection manifold, which is fluidly coupled to the spin-processing system 700 via a gas supply line 764. In operation, the gas supply system 766 may selectively apply desired gas(es) to the process chamber 710 via the gas supply line 764 and the gas nozzle 760 positioned within the process chamber 710. Thus, the gas supply system 766 can be used to dispense the gas(es) into the process chamber 710. The process chamber 710 may further include a gas exhaust line (not shown) for removing or exhausting from the process chamber 710.

Components of the spin-processing system 700 can be coupled to, and controlled by, a controller 770, which in turn, can be coupled to a corresponding memory storage unit and user interface (not shown). Various processing operations can be executed via the user interface, and various processing recipes and operations can be stored in the memory storage unit. Accordingly, a given substrate 730 can be processed within the process chamber 710 in accordance with a particular recipe. In some embodiments, a given substrate 730 can be processed within the process chamber 710 in accordance with a recipe that utilizes the techniques disclosed herein to control the formation of a SAM structure utilized in an ASD process and prevent defects in the ASD process.

The controller 770 shown in block diagram form in FIG. 7 can be implemented in a wide variety of manners. In one example, the controller 770 may be a computer. In another example, the controller 770 may include one or more programmable integrated circuits that are programmed to provide the functionality described herein. For example, one or more processors (e.g., microprocessor, microcontroller, central processing unit, etc.), programmable logic devices (e.g., complex programmable logic device (CPLD), field programmable gate array (FPGA), etc.), and/or other programmable integrated circuits can be programmed with software or other programming instructions to implement the functionality of a prescribed plasma process recipe. It is further noted that the software or other programming instructions can be stored in one or more non-transitory computer-readable mediums (e.g., memory storage devices, flash memory, dynamic random access memory (DRAM), reprogrammable storage devices, hard drives, floppy disks, DVDs, CD-ROMs, etc.), and the software or other programming instructions when executed by the programmable integrated circuits cause the programmable integrated circuits to perform the processes, functions, and/or capabilities described herein. Other variations could also be implemented.

As shown in FIG. 7, the controller 770 may be coupled to various components of the spin-processing system 700 to receive inputs from, and provide outputs to, the components. For example, the controller 770 may be coupled to: the process chamber 710 for controlling the temperature and/or pressure within the process chamber 710; the spinner 720 for controlling the rotational speed of the spinner 720; the chemical supply system 746 for controlling the various liquid solutions 742 dispensed onto the substrate 730; and the gas supply system 766 for controlling the gas(es) and/or the gas flow rate of gas(es) dispensed into the process chamber 710. The controller 770 may control other processing system components not shown in FIG. 7, as is known in the art.

In some embodiments, the controller 770 may control the various components of the spin-processing system 700 in accordance with a recipe that utilizes the techniques described herein to control the formation of a SAM structure utilized in an ASD process and prevent defects in the ASD process. For example, the controller 770 may supply various control signals to the chemical supply system 746, which cause the chemical supply system 746 to dispense: (a) a cleaning solution onto the surface of the substrate 730 to remove surface contaminants, (b) a SAM-forming solution onto the surface of the substrate 730 to selectively deposit a SAM structure on exposed surfaces of the non-target material, and (c) a rinse solution to wash away excess SAM-forming solution from the surface of the substrate 730 after bonding SAM-forming molecules to the exposed surfaces of the non-target material.

In some embodiments, the controller 770 may control and/or vary one or more process parameters used during the anneal step shown in FIG. 3 to control the selectivity of the SAM structure formed on the exposed surfaces of the non-target material. For example, the controller 770 may supply various control signals to the gas supply system 766 to control the gas(es), the gas flow rate and/or the pressure within the process chamber 710 during the anneal step. In some embodiments, the controller 770 may supply various control signals to the process chamber 710 and/or the spinner 720 to control the temperature within the process chamber 710 or a temperature of the substrate 730 mounted onto the spinner 720 during the anneal step. In addition to controlling the anneal temperature, the controller 770 may supply control signals to the process chamber 710 and/or the spinner 720 to control the anneal time. The gas(es), gas flow rate/pressure, anneal temperature and/or anneal time may be controlled and/or varied as discussed above.

FIGS. 8-9 illustrate exemplary methods that utilize the techniques disclosed herein to control the formation of a SAM structure utilized in an ASD process and prevent defects in the ASD process. It will be recognized that the embodiments of FIGS. 8-9 are merely exemplary and additional methods may utilize the techniques described herein. Further, additional processing steps may be added to the methods shown in FIGS. 8-9 as the steps described are not intended to be exclusive. Moreover, the order of the steps is not limited to the order shown in the figures as different orders may occur and/or various steps may be performed in combination or at the same time.

FIG. 8 illustrates one embodiment of a method 800 that may be used to control formation of a self-assembled monolayer (SAM) structure utilized in an area-selective deposition (ASD) process in accordance with the present disclosure. The method 800 may generally begin by provid-
ing a substrate within a process chamber, the substrate
having a target material and a non-target material exposed
on a surface of the substrate (in step 810). Next, the method
800 may include forming the SAM structure on an exposed
surface of the non-target material (in step 820) by: (a)
dispensing a liquid solution onto the surface of the substrate
while the substrate is spinning to coat the surface of sub-
strate with the liquid solution, the liquid solution comprising
SAM-forming molecules; and (b) heat treating the substrate
to chemically bond the SAM-forming molecules to the
exposed surface of the non-target material and form the
SAM structure on the exposed surface of the non-target
material.

The method 800 further includes controlling one or more
process parameters used during said heat treating to ensure
that the SAM structure completely covers the exposed
surface of the non-target material and prevent the SAM
structure from extending beyond boundaries of the non-
target material and covering portions of the target material
(in step 830). In some embodiments, the method 800 may
further include selectively depositing a film on an exposed
surface of the target material after forming the SAM struc-
ture on the exposed surface of the non-target material. By
controlling the one or more process parameters during said
heat treating (in step 830), the method 800 reduces defects
in the ASD process by ensuring that the film completely
covers the exposed surface of the target material.

FIG. 9 illustrates one embodiment of a method 900 that
may be used to reduce edge exclusion defects in a dielectric-
on-dielectric (DoD) process in accordance with the present
disclosure. The method 900 may generally begin by provid-
ing a substrate within a process chamber, the substrate
having a metal layer and a dielectric layer exposed on a
surface of the substrate (in step 910). Next, the method 900
may include selectively depositing a self-assembled mono-
layer (SAM) structure on an exposed surface of the metal
layer (in step 920) by: (a) dispensing a liquid solution onto
the surface of the substrate while the substrate is spinning to
coat the surface of substrate with the liquid solution, the
liquid solution comprising SAM-forming molecules; and (b)
heat treating the substrate to chemically bond the SAM-
forming molecules to the exposed surface of the metal layer
and form the SAM structure on the exposed surface of the
metal layer.

The method 900 further includes controlling one or more
process parameters used during said heat treating to ensure
that the SAM structure completely covers the exposed
surface of the metal layer and prevent the SAM structure
from extending beyond boundaries of the metal layer and
covering portions of the dielectric layer (in step 930), and
selectively depositing a dielectric film on an exposed surface
of the dielectric layer after forming the SAM structure on the
exposed surface of the metal layer (in step 940). By con-
trolling the one or more process parameters during said heat
treating (in step 930), the method 900 reduces edge exclu-
sion defects in the DoD process by ensuring that the dielec-
tric film completely covers the exposed surface of the
dielectric layer.

The methods 800 and 900 shown in FIGS. 8 and 9 may
control a wide variety of process parameters during the heat
treating (or anneal step) used to form the SAM structure in
steps 820 and 920. For example, the one or more process
parameters controlled in steps 830 and 930 may include one
or more of a gas, a gas flow rate, a pressure within the
process chamber, a temperature and a time used during the
heat treating (or anneal step).

In some embodiments, the one or more process param-
eters may be controlled in steps 830 and 930 by selecting the
gas, the gas flow rate, the pressure within the process
chamber, the temperature and/or the time to be used during
said heat treating based on experimental results. For
example, the one or more process parameters may be
controlled in steps 830 and 930 by selecting: (a) the gas from
a group of gases comprising nitrogen ($N_2$), ammonia ($NH_3$),
helium (He), and argon (Ar), (b) the gas flow rate from a
range of gas flow rates comprising about 4 liters/minute
(L/min) to about 7 L/min, (c) the temperature from a range
of temperatures comprising about 130° C. to about 180° C.,
and/or (d) the time from a range of times comprising about
60 seconds to about 180 seconds.

In other embodiments, the one or more process param-
eters may be controlled in steps 830 and 930 by varying one
or more of the gas, the gas flow rate, the pressure within the
process chamber, the temperature and the time during said
heat treating based on a predetermined recipe or based on
feedback control. In one example, the one or more process
parameters may be controlled in steps 830 and 930 by
varying the temperature. In another example, the one or
more process parameters may be controlled in steps 830 and
930 by varying the pressure.

It is noted that reference throughout this specification to
"one embodiment" or "an embodiment" means that a par-
ticular feature, structure, material, or characteristic
described in connection with the embodiment is included in
at least one embodiment of the invention, but do not denote
that they are present in every embodiment. Thus, the appear-
ances of the phrases "in one embodiment" or "in an embodi-
ment" in various places throughout this specification are not
necessarily referring to the same embodiment of the inven-
tion. Furthermore, the particular features, structures, mate-
rials, or characteristics may be combined in any suitable
manner in one or more embodiments. Various additional
layers and/or structures may be included and/or described
features may be omitted in other embodiments.

The term "substrate" as used herein means and includes a
base material or construction upon which materials are
formed. It will be appreciated that the substrate may include
a single material, a plurality of layers of different materials,
a layer or layers having regions of different materials or
different structures in them, etc. These materials may include
semiconductors, insulators, conductors, or combinations
thereof. For example, the substrate may be a semiconductor
substrate, a base semiconductor layer on a supporting struc-
ture, a metal electrode or a semiconductor substrate having
one or more layers, structures or regions formed thereon.
The substrate may be a conventional silicon substrate or
other bulk substrate comprising a layer of semi-conductive
material. As used herein, the term "bulk substrate" means
and includes not only silicon wafers, but also silicon-on-
insulator ("SOI") substrates, such as silicon-on-sapphire
("SOS") substrates and silicon-on-glass ("SOG") substrates,
epitaxial layers of silicon on a base semiconductor founda-
tion, and other semiconductor or optoelectronic materials,
such as silicon-germanium, germanium, gallium arsenide,
gallium nitride, and indium phosphide. The substrate may be
doped or undoped.

Systems and methods for processing a substrate are
described in various embodiments. The substrate may
include any material portion or structure of a device, par-
ticularly a semiconductor or other electronics device, and
may, for example, be a base substrate structure, such as a
semiconductor substrate or a layer on or overlying a base
substrate structure such as a thin film. Thus, substrate is not intended to be limited to any particular base structure, underlying layer or overlying layer, patterned or unpatterned, but rather, is contemplated to include any such layer or base structure, and any combination of layers and/or base structures.

One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the inventions are described herein with reference to specific embodiments, various modifications and changes can be made without departing from the scope of the present inventions. Accordingly, the specification and figures are to be regarded in an illustrative rather than a restrictive sense, and such modifications are intended to be included within the scope of the present inventions. Further, any benefits, advantages, or solutions to problems that are described herein with regard to specific embodiments are not intended to be construed as a critical, required, or essential feature or element of any or all the claims.

What is claimed is:

1. A method to reduce edge exclusion defects in a dielectric-on-dielectric (DoD) process, the method comprising:
providing a substrate within a process chamber, the substrate having a metal layer and a dielectric layer exposed on a surface of the substrate;
selectively depositing a self-assembled monolayer (SAM) structure on an exposed surface of the metal layer by:
dispensing a liquid solution onto the surface of the substrate while the substrate is spinning to coat the surface of substrate with the liquid solution, the liquid solution comprising SAM-forming molecules; and
heat treating the substrate to chemically bond the SAM-forming molecules to the exposed surface of the metal layer and form the SAM structure on the exposed surface of the metal layer;
controlling a plurality of process parameters used during said heat treating to ensure that the SAM structure completely covers the exposed surface of the metal layer and prevent the SAM structure from extending beyond boundaries of the metal layer and covering portions of the dielectric layer, wherein the plurality of process parameters controlled during said heat treating comprise a gas, a gas flow rate, a pressure within the process chamber, a temperature and a time; and
selectively depositing a dielectric film on an exposed surface of the dielectric layer without removing the SAM structure selectively deposited on the exposed surface of the metal layer, wherein said controlling the plurality of process parameters during said heat treating reduces edge exclusion defects in the DoD process by ensuring that the dielectric film completely covers the exposed surface of the dielectric layer.

2. The method of claim 1, wherein said controlling the plurality of process parameters comprises selecting the gas, the gas flow rate, the pressure within the process chamber, the temperature and the time to be used during said heat treating, wherein said selecting is based on experimental results.

3. The method of claim 1, wherein said controlling the plurality of process parameters comprises selecting the gas from a group of gases comprising nitrogen ($N_2$), ammonia ($NH_3$), helium (He) and argon (Ar).

4. The method of claim 1, wherein said controlling the plurality of process parameters comprises selecting the gas flow rate from a range of gas flow rates comprising about 4 liters/minute (L/min) to about 7 L/min.

5. The method of claim 1, wherein said controlling the plurality of process parameters comprises selecting the temperature from a range of temperatures comprising about 130° C. to about 180° C.

6. The method of claim 1, wherein said controlling the plurality of process parameters comprises selecting the time from a range of times comprising about 60 seconds to about 180 seconds.

7. The method of claim 1, wherein said controlling the plurality of process parameters comprises varying one or more of the gas, the gas flow rate, the pressure within the process chamber, the temperature and the time during said heat treating based on a predetermined recipe or based on feedback control.

8. A method to control formation of a self-assembled monolayer (SAM) structure utilized in an area-selective deposition (ASD) process, the method comprising:
providing a substrate within a process chamber, the substrate having a target material and a non-target material exposed on a surface of the substrate;
forming the SAM structure on an exposed surface of the non-target material by:
dispensing a liquid solution onto the surface of the substrate while the substrate is spinning to coat the surface of substrate with the liquid solution, the liquid solution comprising SAM-forming molecules; and
heat treating the substrate to chemically bond the SAM-forming molecules to the exposed surface of the non-target material and form the SAM structure on the exposed surface of the non-target material; and
controlling a plurality of process parameters used during said heat treating to ensure that the SAM structure completely covers the exposed surface of the non-target material and prevent the SAM structure from extending beyond boundaries of the non-target material and covering portions of the target material, wherein the plurality of process parameters controlled during said heat treating comprise a gas, a gas flow rate, a pressure within the process chamber, a temperature and a time.

9. The method of claim 8, further comprising selectively depositing a film on an exposed surface of the target material without removing the SAM structure formed on the exposed surface of the non-target material, wherein said controlling the one or more process parameters during said heat treating ensures that the film completely covers the exposed surface of the target material.

10. The method of claim 9, wherein the non-target material is a conductive material, the target material is a dielectric material and the film is a dielectric film.

11. The method of claim 10, wherein the SAM-forming molecules have a head group, which bonds to the exposed surface of the conductive material, and a tail group that provides a barrier against the dielectric film.

12. The method of claim 11, wherein the SAM-forming molecules have a thiol, silane, phosphate, amine or carboxylic acid head group.

13. The method of claim 8, wherein said controlling the plurality of process parameters comprises selecting one or more of the gas, the gas flow rate, the pressure within the process chamber, the temperature and the time to be used during said heat treating, wherein said selecting is based on experimental results.

14. The method of claim 8, wherein said controlling the plurality of process parameters comprises selecting the gas from a group of gases comprising nitrogen (N$_2$), ammonia (NH$_3$), helium (He), and argon (Ar).

15. The method of claim 8, wherein said controlling the plurality of process parameters comprises selecting the gas flow rate from a range of gas flow rates comprising about 4 liters/minute (L/min) to about 7 L/min.

16. The method of claim 8, wherein said controlling the plurality of process parameters comprises selecting the temperature from a range of temperatures comprising about 130° C. to about 180° C.

17. The method of claim 8, wherein said controlling the plurality of process parameters comprises selecting the time from a range of times comprising about 60 seconds to about 180 seconds.

18. The method of claim 8, wherein said controlling the plurality of process parameters comprises varying one or more of the gas, the gas flow rate, the pressure within the process chamber, the temperature and the time during said heat treating based on a predetermined recipe or based on feedback control.

* * * * *